United States Patent
Wang et al.

(10) Patent No.: US 7,258,963 B2
(45) Date of Patent: Aug. 21, 2007

(54) PHOTOSENSITIVE RESIN, PHOTORESIST COMPOSITION HAVING THE PHOTOSENSITIVE RESIN AND METHOD OF FORMING A PHOTORESIST PATTERN BY USING THE PHOTORESIST COMPOSITION

(75) Inventors: Youn-Kyung Wang, Gyeonggi-do (KR); Kyoung-Mi Kim, Gyeonggi-do (KR); Young-Ho Kim, Gyeonggi-do (KR); Jae-Hyun Kim, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/333,934

(22) Filed: Jan. 17, 2006

(65) Prior Publication Data

US 2006/0160019 A1    Jul. 20, 2006

(30) Foreign Application Priority Data

Jan. 17, 2005    (KR) .................... 10-2005-0004194

(51) Int. Cl.
*G03F 7/039*    (2006.01)
*G03F 7/30*    (2006.01)

(52) U.S. Cl. .................. 430/270.1; 430/326; 430/905; 430/910; 430/914

(58) Field of Classification Search ............ 430/270.1, 430/326, 905, 910, 914
See application file for complete search history.

(56) References Cited

U.S. PATENT DOCUMENTS

| | | | |
|---|---|---|---|
| 6,605,417 B2* | 8/2003 | Nitta et al. ................. | 430/326 |
| 6,756,179 B2* | 6/2004 | Fujimori et al. ......... | 430/270.1 |
| 6,921,621 B2* | 7/2005 | Nitta et al. ................. | 430/170 |
| 7,147,987 B2* | 12/2006 | Mizutani ................. | 430/270.1 |
| 2002/0098440 A1* | 7/2002 | Sato et al. ................ | 430/270.1 |
| 2004/0166432 A1* | 8/2004 | Ohsawa et al. ............. | 430/170 |
| 2006/0014098 A1* | 1/2006 | Hada et al. .............. | 430/270.1 |

FOREIGN PATENT DOCUMENTS

| | | |
|---|---|---|
| JP | 2002-221795 | 8/2002 |
| JP | 2004-212975 | 7/2004 |
| KR | 2001-0089151 | 9/2001 |

OTHER PUBLICATIONS

English language abstract of Korean Publication No. 2001-0089151.
English language abstract of Japanese Publication No. 2002-221795.
English language abstract of Japanese Publication No. 2004-212975.

* cited by examiner

*Primary Examiner*—Richard L. Schilling
(74) *Attorney, Agent, or Firm*—Marger Johnson & McCollom, P.C.

(57) ABSTRACT

In a photosensitive resin, a photoresist composition having the photosensitive resin, and a method of forming a photoresist pattern by using the photoresist, the photosensitive resin includes a blocking group substituted for an acid. The photosensitive resin has a weight-average molecular weight of from about 6,000 up to about 8,000. The photosensitive resin has a blocking ratio of from about 5% up to about 40%.

14 Claims, 5 Drawing Sheets

FIG. 2
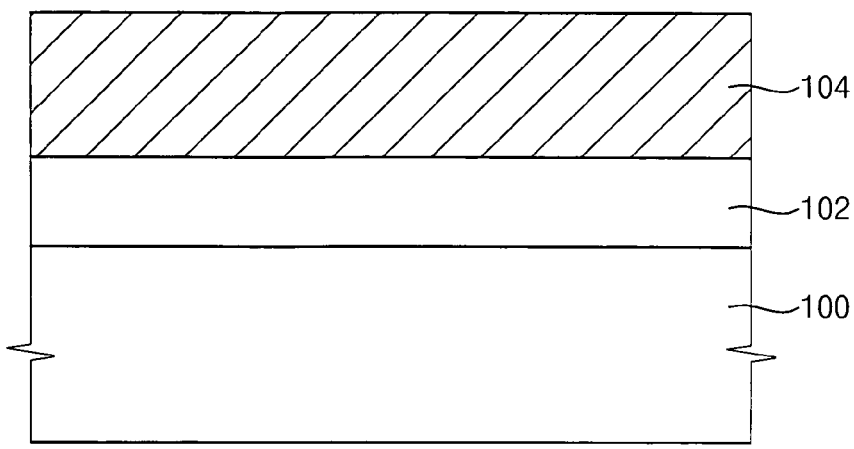
FIG. 3
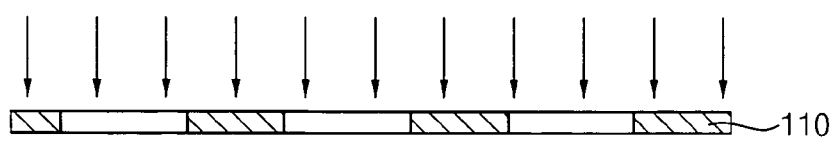
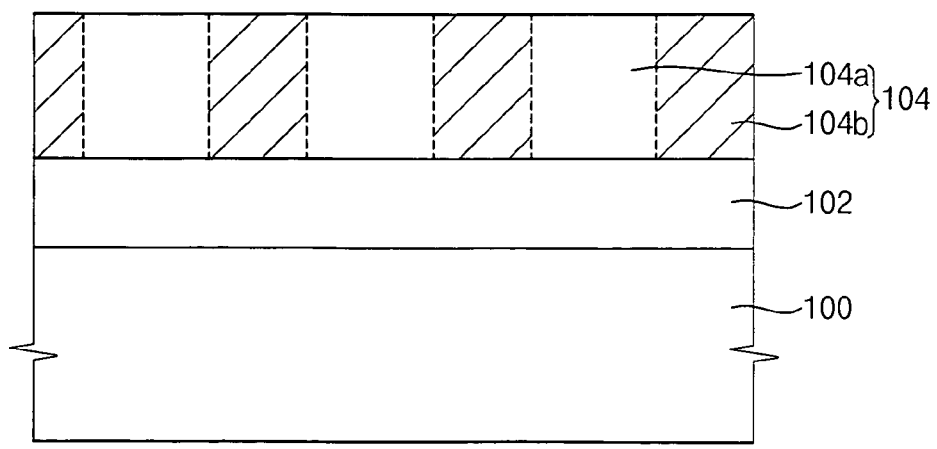

PHOTOSENSITIVE RESIN, PHOTORESIST COMPOSITION HAVING THE PHOTOSENSITIVE RESIN AND METHOD OF FORMING A PHOTORESIST PATTERN BY USING THE PHOTORESIST COMPOSITION

CROSS REFERENCE TO RELATED APPLICATION

This application claims benefit of priority under 35 U.S.C. § 119 from Korean Patent Application No. 2005-0004194 filed on Jan. 17, 2005, the disclosure of which is incorporated herein by reference in its entirety.

BACKGROUND OF THE INVENTION

1. Field of the Invention

The present invention relates to a photosensitive resin, a photoresist composition having the photosensitive resin and a method of forming a photoresist pattern by using the photoresist composition. More particularly, the present invention relates to a photosensitive resin used for forming a pattern in a semiconductor device, a photoresist composition having the photosensitive resin and a method of forming a photoresist pattern by using the photoresist composition.

2. Description of the Related Art

Recently, as information media, such as computers, have become widely used, semiconductor devices included in the information media have become highly developed to have large capacities and high operational speeds. Thus, integrity, reliability and a response speed of the semiconductor device have been largely improved. In order to manufacture the semiconductor device, a photolithography process capable of forming a photoresist pattern having a relatively small line width is required.

The photolithography process for forming the photoresist pattern uses a photoresist composition. In case that light is incident onto a photoresist layer formed using the photoresist composition, a solubility of the photoresist composition in a developer may be changed. Particularly, the light may be provided onto a portion of the photoresist layer in an exposure process. The exposed portion of the photoresist layer is then removed in a development process using the developer. Thus, a desired photoresist pattern may be obtained.

The photoresist composition may include a resin. It is necessary that the resin have a high solubility in a solvent used in a coating process, a low absorbency of a light having a predetermined wavelength, a suitable adhesion and thermal stability.

Because the processes for manufacturing the semiconductor device are becoming complex, and the semiconductor device is becoming highly integrated, an improved photoresist composition capable of forming a fine photoresist pattern is being largely researched. In order to efficiently form the fine photoresist pattern, it is required that a difference in a solubility of the photoresist composition in the developer, between before and after the exposure process, is relatively large.

In order to increase the difference in the solubility, a conventional photoresist composition having a relatively low solubility in the developer before the exposure process has been used. However, in case that the conventional photoresist composition is used to form a conventional photoresist pattern, microbubble defects are unfortunately formed on the conventional photoresist pattern.

FIG. 1 is a cross-sectional view illustrating the microbubble defects generated on the conventional photoresist pattern formed using the conventional photoresist composition.

As illustrated in FIG. 1, particles 16 of an exposed portion of a photoresist layer formed using the conventional photoresist composition are attached to the conventional photoresist pattern 12 in the development process so that the microbubble defects 14 may be formed on the conventional photoresist formed on a substrate 10.

An example of a photoresist composition capable of suppressing the microbubble defects is disclosed in Japanese Patent Laid-Open Publication No. 2002-221795.

The photoresist composition of Japanese Patent Laid-Open Publication No. 2002-221795 includes a first resin and a second resin. The first resin and the second resin have a first degree of dispersion and a second degree of dispersion, respectively. A ratio of the first degree of dispersion to the second degree of dispersion is about 1.3 to about 9.9. In addition, the photoresist composition of Japanese Patent Laid-Open Publication No. 2002-221795 further includes a phenol compound including a hydroxide (OH) group to increase a solubility of the photoresist composition in a developer. In case that the photoresist composition of Japanese Patent Laid-open Publication No. 2002-221795 is used to form a photoresist pattern, a line edge roughness (LER) of the photoresist pattern is improved. However, the microbubble defects may still formed on the photoresist pattern.

Thus, an improved photoresist composition capable of forming a fine photoresist pattern on which the microbubble defects are hardly generated is widely researched.

SUMMARY

Embodiments of the present invention can provide a photosensitive resin capable of suppressing a microbubble defect. Some embodiments of the present invention can also provide a photoresist composition having the photosensitive resin. Some other embodiments of the present invention provide a method of manufacturing a photoresist pattern by using the photoresist composition.

A photosensitive resin can be provided. The photosensitive resin comprises a blocking group substituted for an acid. The photosensitive resin also has a weight-average molecular weight of from about 6,000 up to about 8,000, and a blocking ratio of from about 5% up to about 40%. Preferably, the photosensitive resin has a weight-average molecular weight of from about 6,300 up to about 7,700, and a blocking ratio is from about 30% up to about 40%. The photosensitive resin can be selected from the group consisting of an acrylate resin, a vinyl ether-maleic anhydride resin, a cyclo-olefin-maleic anhydride resin and a cyclo-olefin resin.

A photoresist composition can also be provided comprising the photosensitive resin described above, a photo-acid generator, and an organic solvent. Preferably, the photosensitive resin is from about 1 up to about 10 percent by weight, the photo-acid generator is from about 0.1 up to about 1 percent by weight, and the residual is the organic solvent. The photo-acid generator can be selected from the group consisting of a triarylsulfonium salt, a diaryliodonium salt, a sulfonate and an N-hydroxysuccinimide triflate.

The organic solvent can also be selected from the group consisting of ethylene glycol monomethyl ether, ethylene glycol monoethyl ether, propylene glycol methyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, diethylene glycol dimethyl ether, ethyl lactate, toluene, xylene, methyl ethyl ketone, cyclohexanone, 2-heptanone, 3-heptanone and 4-heptanone, or combinations thereof.

The photoresist composition can further comprise an organic base. Preferably, the organic base is from about 0.001 up to about 1 percent by weight, based on a total weight of the photoresist composition measured before the organic base is added. Preferably, a contact angle of pure water on a photoresist layer formed using the photoresist composition is from about 68° up to about 72°.

A method of forming a photoresist pattern can further be provided. The method can comprise coating an object with a photoresist composition including a photosensitive resin, a photo-acid generator and an organic solvent to form a photoresist layer on the object. The photosensitive composition and the photoresist resin are as described above. Light is selectively introduced onto the photoresist layer to divide the photoresist layer into a first portion and a second portion. The first portion provided with the light is substantially hydrophilic. The second portion is not provided with the light. Thus, a photoresist pattern is formed by selectively removing the first portion and substantially preventing particles of the first portion from being attached to the second portion.

As a result, a hydrophobicity of a photoresist composition including the photoresist resin may be relatively low. Consequently, in case that a photoresist layer formed using the photoresist composition is developed, a removed portion of the photoresist layer may be hardly attached to a remaining portion of the photoresist layer. That is, a microbubble defect may be suppressed in a development process.

BRIEF DESCRIPTION OF THE DRAWINGS

The above and other advantages of the present invention will become readily apparent by reference to the following detailed description when considered in conjunction with the accompanying drawings in which:

FIGS. 2 to 4 are cross-sectional views illustrating methods of manufacturing a photoresist pattern in accordance with embodiments of the present invention;

DETAILED DESCRIPTION OF THE INVENTION

Figure 1:
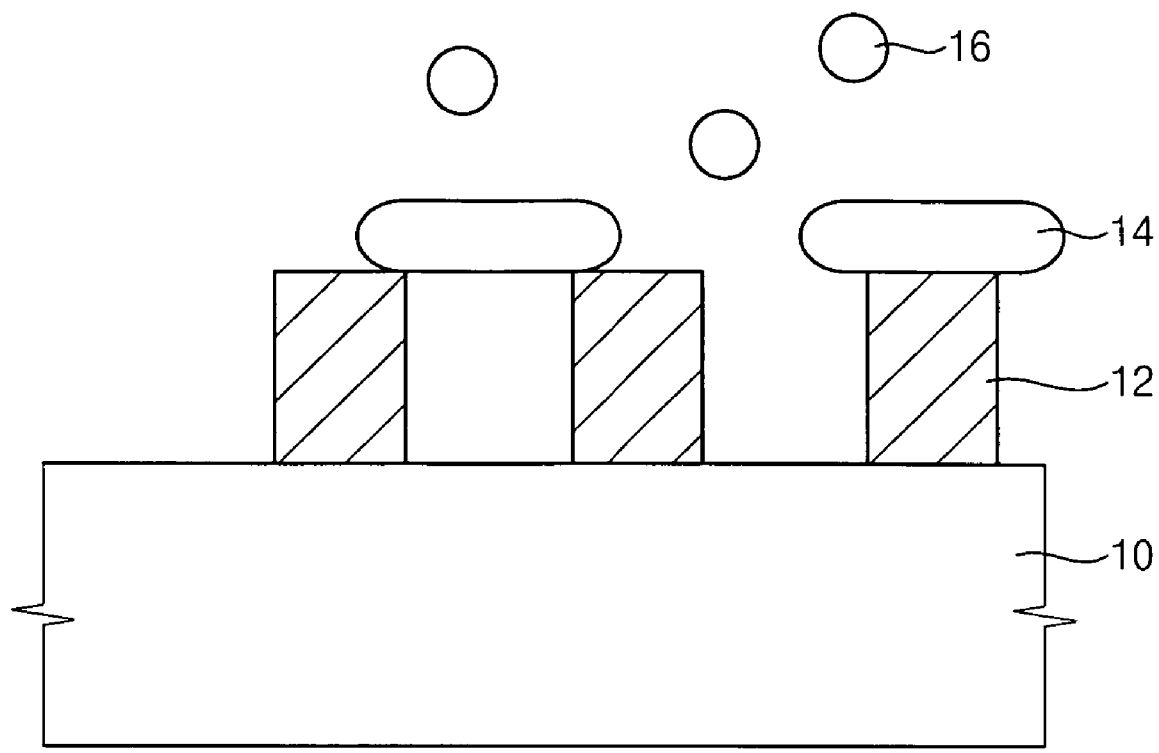
FIG. 1 is a cross-sectional view illustrating microbubble defects generated on a conventional photoresist pattern formed using a conventional photoresist composition.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the sizes and relative sizes of elements or components may be exaggerated for clarity. The drawings are not to scale. Like reference numerals refer to like elements throughout.

It will be understood that when an element or a component is referred to as being "on" another element or component, the element or component may be directly on the other element or component or intervening elements or components may be present.

It will be understood that, although the terms first, second, etc. may be used herein to describe various elements and/or components. These elements and/or components should not be limited by these terms. These terms may be used to distinguish one element and/or component from another element and/or component. For example, a first element and/or component discussed below could be termed a second element and/or component without departing from the teachings of the present invention.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, elements, and/or components, but do not preclude the presence and/or addition of one or more other features, integers, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Photosensitive Resin

A photosensitive resin includes a blocking group, an adhesion group, a wetting group, an etching resistance compensation group, etc. In case that the photosensitive resin is provided with an acid such as a hydrogen ion ($H^+$) and activation energy, the acid may easily substitute for the blocking group in the photosensitive resin. Thus, the blocking group may be dissociated from the photosensitive resin.

If the weight-average molecular weight of the photosensitive resin is greater than about 8,000, a hydrophobicity of a photoresist layer formed using the photosensitive resin may increase. Thus, microbubble defects may be generated in a development process for partially removing the photoresist layer, to form a photoresist pattern. On the other hand, if the weight-average molecular weight of the photosensitive resin is below about 6,000, the microbubble defects may hardly be generated in the development process. However, the depth of focus (DOF) is relatively insufficient so that line edge roughness (LER) may be generated.

Thus, the weight-average molecular weight of the photosensitive resin may preferably be from about 6,000 up to about 8,000. More preferably, the weight-average molecular weight of the photosensitive resin may be from about 6,300 up to about 7,700. Most preferably, the weight-average molecular weight of the photosensitive resin may be from about 6,700 up to about 7,300.

The amount of a reaction monomer, the reaction time of the monomer and/or the reaction temperature of the reaction monomer may be controlled to adjust the weight-average molecular weight of the photosensitive resin.

Examples of the photosensitive resin may include an acrylate resin, a vinyl ether-maleic anhydride (VEMA) resin, a cyclo-olefin-maleic anhydride (COMA) resin or a cyclo-olefin (CO) resin. These materials may be used alone or in combination. An example of the acrylate resin is a methacrylate resin.

A formula of the blocking group in the photosensitive resin may be "—$CR_1R_2C(=O)OR_3$." Here, each of $R_1$ and $R_2$ is independently selected from hydrogen, an electron withdrawing group such as halogen, lower alkyl having 1 to about 10 carbon atoms, and substituted lower alkyl having 1 to about 10 carbon atoms, and $R_3$ is a substituted or unsubstituted lower alkyl having 1 to about 10 carbon atoms, a substituted or unsubstituted aryl having 1 to about 10 carbon atoms, or a substituted or unsubstituted benzyl groups having 7 to about 10 carbon atoms.

A chemical equation of a reaction of the methacrylate resin is as follows. Particularly, the methacrylate resin can be a 2-methyl-2-adamantanol methacrylate resin.

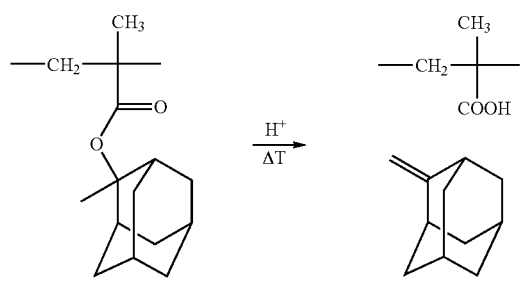

The blocking group in the photosensitive resin may have a relatively high hydrophobicity. In the above chemical equation, the blocking group corresponds to an adamantanol group. Thus, in case that a blocking ratio of the photosensitive resin increases, the hydrophobicity of the photosensitive resin may also increase.

Here, the blocking ratio is the number of polymer chains combined with the blocking group with respect to the total number of the polymer chains in the photosensitive resin.

As shown in the above chemical equation, in case that the photosensitive resin including the blocking group is provided with the hydrogen ion ($H^+$) and the activation energy, the blocking group may be dissociated from the photosensitive resin. That is, the hydrogen ion ($H^+$) substitutes for the blocking group to form a carboxyl group (—COOH). Thus, the hydrophobicity of the photosensitive resin may decrease.

In case that the blocking ratio of the photosensitive resin is above about 40%, a diffusion of the hydrogen ion ($H^+$) may be relatively fast. Thus, the control of a photo-acid reaction may be relatively difficult. In addition, because the photo-acid reaction occurs more in an upper portion of the photoresist layer than a lower portion of the photoresist layer, a desired shape of the photoresist pattern may hardly be obtained. Furthermore, the hydrophobicity of the photoresist layer formed using the photosensitive resin may be relatively high. Thus, the microbubble defects may be generated in the development process for partially removing the photoresist layer to form the photoresist pattern. On the other hand, in case that the blocking ratio is below about 5%, the photo-acid reaction is relatively slow. Thus, it is difficult to form a photoresist pattern having a relatively small line width. In addition, the LER may be generated. As a result, the blocking ratio of the photosensitive resin is preferably from about 5% up to about 40%. More preferably, the blocking ratio may be from about 30% up to about 40%.

Photoresist Composition

A photoresist composition includes a photosensitive resin, a photo-acid generator and a residual of a solvent in accordance with some embodiments of the present invention. In case that the photosensitive resin is provided with light, characteristics of the photosensitive resin may vary. The photo-acid generator may supply a hydrogen ion ($H^+$).

In case that the photoresist composition includes below about 1 percent by weight of the photosensitive resin, it is difficult to efficiently form a photoresist pattern generally used as an etch mask. On the other hand, in case that the photoresist composition includes above about 10 percent by weight of the photosensitive resin, it is difficult to form a photoresist layer having a relatively uniform thickness. Thus, a photoresist pattern formed by partially removing the photoresist layer may have an irregular thickness. As a result, the photoresist composition is preferably from about 1 percent by weight up to about 10 percent by weight of the photosensitive resin.

In the case where the photoresist composition includes from about 1 percent by weight up to about 5 percent by weight of the photosensitive resin, a photoresist pattern having a line width of below about 100 nm may be efficiently formed. Thus, it is preferable that the photoresist composition includes from about 1 percent by weight up to about 5 percent by weight of the photosensitive resin.

A weight-average molecular weight of the photosensitive resin in the photoresist composition may preferably be from about 6,000 up to about 8,000. More preferably, the weight-average molecular weight of the photosensitive resin in the photoresist composition is from about 6,300 up to about 7,700. Most preferably, the weight-average molecular weight of the photosensitive resin in the photoresist composition may be from about 6,700 up to about 7,300.

The photosensitive resin is preferably easily soluble in the solvent without a reaction with the solvent. In addition, the photosensitive resin preferably has a suitable drying rate. Thus, the photosensitive resin is capable of forming a photoresist layer having a relatively uniform thickness after the solvent is volatilized.

Examples of photosensitive resins which may be employed herein comprise an acrylate resin, a vinyl ether-maleic anhydride (VEMA) resin, a cyclo-olefin-maleic anhydride (COMA) resin or a cyclo-olefin (CO) resin. These materials may be used alone or in combination. An example of the acrylate resin is a methacrylate resin.

The photosensitive resin includes a blocking group. In case that the photosensitive resin is provided with an acid such as a hydrogen ion ($H^+$) and activation energy, the acid may easily substitute for the blocking group in the photosensitive resin. Thus, the blocking group may be dissociated from the photosensitive resin.

The blocking group in the photosensitive resin may have a substantially high hydrophobicity. Thus, in case that the blocking ratio of the photosensitive resin increases, the hydrophobicity of the photosensitive resin may also increase.

However, in case that the photosensitive resin having the blocking group is provided with hydrogen ion ($H^+$) and activation energy, the blocking group may be dissociated from the photosensitive resin. Thus, the hydrophobicity of the photosensitive resin may decrease.

In case that the blocking ratio of the photosensitive resin increases, a difference in solubility of the photoresist composition in a developer, between before and after an exposure process that is performed on a photoresist layer formed using the photoresist composition, may also increase.

Thus, the solubility of the photoresist composition in the developer may be relatively low before the exposure process is performed on the photoresist layer. On the other hand, the solubility of the photoresist composition in the developer may be relatively high after the exposure process is performed on the photoresist layer. Accordingly, the photoresist layer may be efficiently patterned to form a photoresist pattern that has a relatively small line width in a development process that uses the developer.

However, in case that the photosensitive resin has a relatively high blocking ratio, the photoresist layer may have a relatively high hydrophobicity before the exposure process. As a result, the photoresist layer may also have the hydrophobicity to some extent after the exposure process.

After the exposure process is performed, the photoresist layer may be divided into a first portion and a second portion. The first portion is exposed by light in the exposure process. On the other hand, the second portion is not exposed by the light in the exposure process. The second portion may be selectively removed by the development process performed after the exposure process.

Because the first portion is still hydrophobic as well as the second portion, a particle of the second portion may be easily attached to the first portion in the development process. Thus, the microbubble defect illustrated in FIG. 1 may be generated in the development process.

In addition, in case that the blocking ratio of the photosensitive resin is excessively high, the solubility of the photoresist layer after the exposure process may be excessively high. Thus, a desired shape of the photoresist pattern may not be obtained. Particularly, an upper portion of the photoresist pattern may be excessively removed.

Thus, the blocking ratio of the photosensitive resin in the photoresist composition may be below about 40%. Preferably, the blocking ratio of the photosensitive resin can be from about 5% up to about 40%. More preferably, the blocking ratio of the photosensitive resin may be from about 30% up to about 40%.

As described above, the weight-average molecular weight of the photosensitive resin in the photoresist composition may be relatively low. Particularly, the weight-average molecular weight of the photosensitive resin in the photoresist composition is preferably from about 6,000 up to about 8,000. Thus, the photosensitive resin of the present invention may have a hydrophobicity substantially lower than a conventional photosensitive resin that has a weight-average molecular weight higher than about 10,000.

As a result, a minimum solubility (Rmin) of the photoresist composition before the exposure process may be substantially higher than that of a conventional photoresist composition including the conventional region in which the weight-average molecular weight is higher than about 10,000.

In addition, when the blocking ratio is maintained below about 40%, a maximum solubility (Rmax) of the photoresist composition after the exposure process may be substantially the same as that of the conventional photoresist composition including the conventional resin having the weight-average molecular weight higher than about 10,000. As a result, the microbubble defects generated in the development process may be efficiently prevented.

As described above, in case that the photoresist composition is provided with the hydrogen ion ($H^+$) and the activation energy, the blocking group may be dissociated from the photosensitive resin in the photoresist composition. The hydrogen ion ($H^+$) may be supplied from the photo-acid generator in the photoresist composition. In case that the photo-acid generator is provided with light, the photo-acid generator may generate the hydrogen ion ($H^+$).

In case that the photoresist composition includes below about 0.1 percent by weight of the photo-acid generator, the amount of the hydrogen ion ($H^+$) generated in the development process can be small. Thus, it is disadvantageous in that the blocking group may not be efficiently dissociated from the photosensitive resin. On the other hand, in case that the photoresist composition includes above about 1 percent by weight of the photo-acid generator, the amount of the hydrogen ion ($H^+$) generated in the development process may be large. Thus, the photoresist composition may be excessively removed in the development. Particularly, an upper portion of the photoresist pattern may be excessively removed.

As a result, the photoresist composition may include from about 0.1 percent by weight up to about 1 percent by weight of the photo-acid generator. Preferably, the photoresist composition includes from about 0.3 percent by weight up to about 0.7 percent by weight of the photo-acid generator.

Examples of the photo-acid generator may include triarylsulfonium salt, diaryliodonium salt, sulfonate or N-hydroxysuccinimide triflate. These materials may be used alone or in combination.

Particularly, examples of the photo-acid generator may include triphenylsulfonium triflate, triphenylsulfonium antimony salt, diphenyliodonium triflate, diphenyliodonium antimony salt, methoxydiphenyliodonium triflate, di-tert-butyldiphenyliodonium triflate, 2,6-dinitrobenzyl sulfonate, pyrogallol tris(alkylsulfonate), norbornene-dicarboxyimide triflate, triphenylsulfonium nonaflate, diphenyliodonium nonaflate, methoxydiphenyliodonium nonaflate, di-tert-butyldiphenyliodonium nonaflate, N-hydroxysuccinimide nonaflate, norbornene dicarboxyimide nonaflate, triphenylsulfonium perfluorooctanesulfonate, diphenyliodonium perfluorooctanesulfonate, methoxyphenyliodonium perfluorooctanesulfonate, di-tert-butyldiphenyliodonium triflate, N-hydroxysuccinimide perfluorooctanesulfonate or norbornene dicarboxyimide perfluorooctanesulfonate. These materials may be used alone or in combination.

The solvent may be an organic solvent. Examples of the organic solvent used for photoresist composition may include ethylene glycol monomethyl ether, ethylene glycol monoethyl ether, propylene glycol methyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, diethylene glycol dimethyl ether, ethyl lactate, toluene, xylene, methyl ethyl ketone, cyclohexanone, 2-heptanone, 3-heptanone or 4-heptanone. These materials may be used alone or in combination.

The photoresist composition may further include an additive such as a quencher which can comprise an organic base. The organic base may prevent a basic compound in the air from affecting the photoresist pattern after the exposure process. An example of the basic compound is an amine. In addition, the quencher may enable the shape of the photoresist pattern to be more easily controlled.

Examples of the organic base are trimethylamine, triethylamine, triisobutylamine, triisooctylamine, triisodecylamine, diethanolamine or triethanolamine. These materials may be used alone or in combination.

The photoresist composition may include from about 0.01 percent by weight up to about 1 percent by weight of the organic base, based on the total weight of the photoresist composition measured before the organic base is added. Thus, in case that the organic base is added to the photoresist composition, the photoresist composition may include from about 1 percent by weight up to about 10 percent by weight of the photosensitive resin, it may also include from about 0.01 percent by weight up to about 1 percent by weight of the photo-acid generator, and it may also include from about 0.0099 percent by weight up to about 1.01 percent by weight of the organic base and a residual of the organic solvent.

In some embodiments, the photoresist composition may further include a surfactant, a sensitizer, an adhesive, a stabilizer, etc. The surfactant may be an ether compound. Examples of the ether compound are polyoxyethylene lauryl ether, polyoxyethylene stearyl ether, polyoxyethylene oleyl ether, polyoxyethylene nonylphenyl ether. These ether compounds may be used alone or in combination. However, the other materials suitable for the surfactant may be also used instead of the ether compound. The sensitizer, the adhesive or the stabilizer may be an amine compound.

In case that an object is coated with the photoresist composition to form a photoresist layer on the object, a contact angle of pure water on a surface of the photoresist layer may be about 68° to about 72°.

Methods of Manufacturing a Photoresist Pattern

Figure 4:
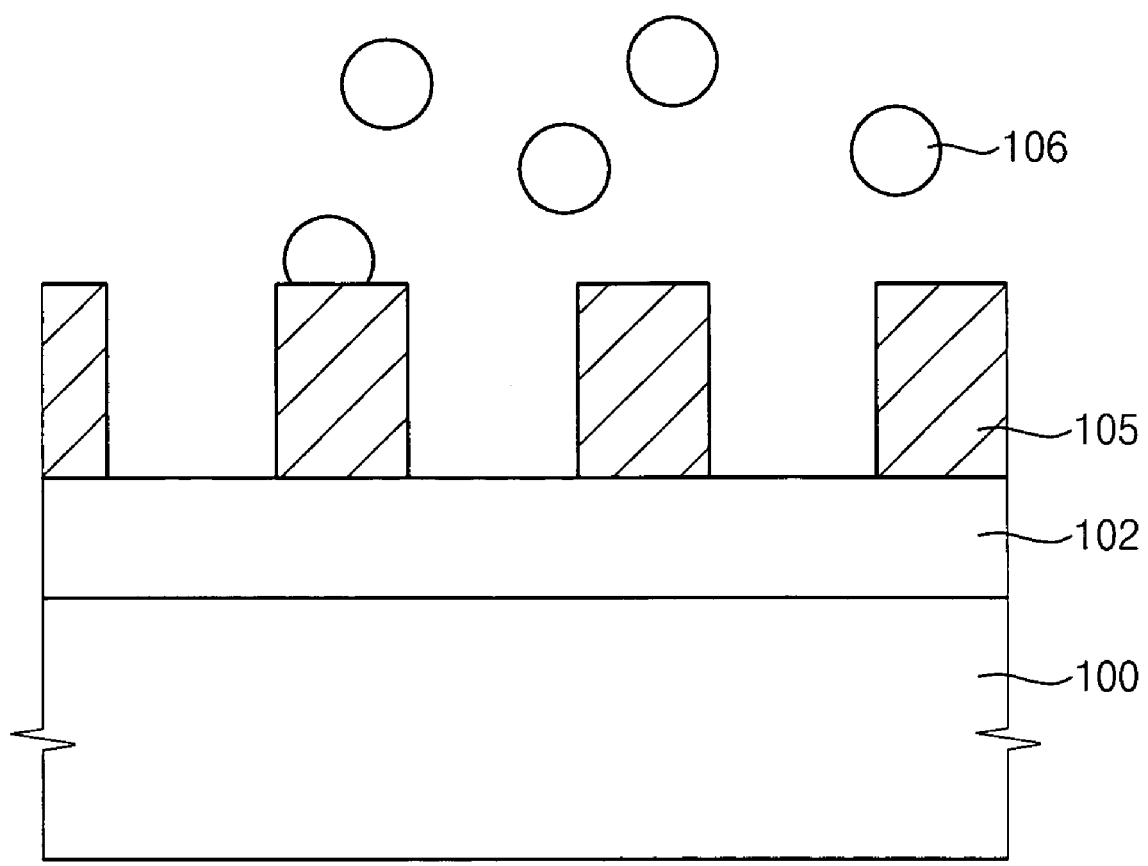

FIGS. 2 to 4 are cross-sectional views illustrating methods of manufacturing a photoresist pattern in accordance with some embodiments of the present invention.

Referring to FIG. 2, a thin film 102 is formed on a semiconductor substrate 100. The thin film 102 may be an object that is subsequently etched. A cleaning process is performed on the thin film 102. Thus, particles residing on the thin film 102 may be removed.

The thin film 102 is then coated with a photoresist composition to form a photoresist layer 104 on the thin film 102. The photoresist composition may include a photosensitive resin having a blocking group. The photosensitive resin having the blocking group may react with a hydrogen ion ($H^+$) so that the blocking group may be easily dissociated from the photoresist composition. This is because the blocking group is unstably associated in the photosensitive resin. A weight-average molecular weight of the photoresist composition may be from about 6,000 up to about 8,000. The photoresist composition may include the photosensitive resin, a photo-acid generator and an organic solvent. The blocking ratio of the photosensitive resin may be from about 5% up to about 40%.

The photoresist composition is substantially the same as the photoresist composition described above, and thus, any further explanation will be omitted.

A first baking process is performed on the semiconductor substrate 100 on which the photoresist layer 104 is formed. The first baking process may be performed at a temperature of from about 90° C. up to about 120° C. The photoresist layer 104 may be firmly adhered to the semiconductor substrate 100 by the first baking process.

Referring to FIG. 3, an exposure process is performed on the photoresist layer 104. Particularly, a mask 110 which selectively blocks light is provided onto a mask stage of an exposure apparatus. The mask 110 is then arranged with respect to the photoresist layer 104.

The light is then selectively incident onto the photoresist layer 104 with the aid of the mask 110. The photoresist layer 104 may be divided into a first portion 104a and a second portion 104b. The first portion 104a is exposed by the light in the exposure process. The second portion 104b is not exposed by the light in the exposure process.

The light employed in the exposure process may include a krypton fluoride (KrF) excimer laser having a wavelength of about 248 nm. Alternatively, the light employed in the exposure process may include an argon fluoride (ArF) excimer laser having a wavelength of about 193 nm.

The first portion 104a may be more hydrophilic than the second portion 104b. Thus, a solubility of the first portion 104a in a developer may be substantially different from that of the second portion 104b. Particularly, the solubility of the first portion 104a may be substantially larger than that of the second portion 104b.

Thereafter, a second baking process is performed on the semiconductor substrate 100. The second baking process may be performed at a temperature of from about 90° C. up to about 150° C. After the second baking process is performed, the first portion 104a of the photoresist layer 104 may become easily soluble in the developer.

Referring to FIGS. 3 and 4, a development process using the developer is performed on the photoresist layer 104 so that the first portion 104a of the photoresist layer 104 may be removed. Thus, a photoresist pattern 105 may be formed. Here, the photoresist pattern 105 may correspond to the second portion 104b of the photoresist layer 104.

Particularly, the first portion 104a of the photoresist layer 104 may dissolve in the developer to form a floating matter 106. The floating particle 106 is then removed. Thus, the photoresist pattern 105 may be formed.

An example of the developer may be tetra-methyl ammonium hydroxide (TMAH). In case that the first portion 104a of the photoresist layer 104 is provided with the developer, particles of the first portion 104a may be separated from the second portion 104b. The particle may correspond to the floating matter 106.

In case that a weight-average molecular weight and a blocking ratio of the photoresist layer 104 used for forming the photoresist layer 104 are from about 6,000 and up to about 8,000 and from about 5% up to about 40%, respectively, the hydrophobicity of the photoresist composition may decrease. Thus, a contact angle of pure water on a surface of the photoresist layer 104 formed by coating the photoresist composition may be from about 68° up to about 72°. Because the second portion 104b has a relatively small hydrophobicity, the first portion 104a may be hydrophilic.

Thus, because there is a difference in affinity for pure water between the first portion 104a and the second portion 104b, the floating matter 106 may not be attached to the second portion 104b. Accordingly, microbubble defects due to reattachment of the floating matter 106 may be efficiently suppressed.

In addition, although the floating matter 106 is attached to the photoresist pattern 105, an area of photoresist pattern 105 contacting the floating matter 106 may be reduced. That is, a width of the floating matter 106 may be substantially smaller than a line width of the photoresist pattern 105. Thus, the microbubble defects may be reduced.

Thereafter, a cleaning process is performed on the photoresist pattern 105. The thin film 102 is then etched using the photoresist pattern 105 as an etching mask.

Hereinafter, a photoresist composition including a photosensitive resin will be described more fully with reference to the following examples and comparative examples.

EXAMPLE

A photoresist composition of this Example included about 2.5 percent by weight of a photosensitive resin, about 0.45 percent by weight of sulfonate, about 0.05 percent by weight of an organic base and about 97 percent by weight of an organic solvent. The photosensitive resin was methacrylate resin having a weight-average molecular weight of about 7,000. The blocking ratio of the methacrylate resin was about 40%. The organic base was a tertiary amine such as trimethylamine. The organic solvent included propylene glycol methyl ether and ethyl lactate. A weight ratio of propylene glycol methyl ether with respect to ethyl lactate was about 4:1.

Comparative Example 1

A photoresist composition of Comparative Example 1 included about 2.5 percent by weight of a photosensitive resin, about 0.45 percent by weight of sulfonate, about 0.05 percent by weight of an organic base and about 97 percent by weight of an organic solvent. The photosensitive resin was methacrylate resin having a weight-average molecular weight of about 11,200. The blocking ratio of the methacrylate resin was about 40%. The organic base was a tertiary amine such as trimethylamine. The organic solvent included propylene glycol methyl ether and ethyl lactate. A weight ratio of propylene glycol methyl ether with respect to ethyl lactate was about 4:1.

Comparative Example 2

A photoresist composition of Comparative Example 2 included about 2.5 percent by weight of a photosensitive resin, about 0.45 percent by weight of sulfonate, about 0.05 percent by weight of an organic base and about 97 percent by weight of an organic solvent. The photosensitive resin was methacrylate resin having a weight-average molecular weight of about 8,400. The blocking ratio of the methacrylate resin was about 40%. The organic base was a tertiary amine such as trimethylamine. The organic solvent included propylene glycol methyl ether and ethyl lactate. A weight ratio of propylene glycol methyl ether with respect to ethyl lactate was about 4:1.

Comparative Example 3

A photoresist composition of Comparative Example 2 included about 2.5 percent by weight of a photosensitive resin, about 0.45 percent by weight of sulfonate, about 0.05 percent by weight of an organic base and about 97 percent by weight of an organic solvent. The photosensitive resin was a methacrylate resin having a weight-average molecular weight of about 5,600. The blocking ratio of the methacrylate resin was about 40%. The organic base was a tertiary amine such as trimethylamine. The organic solvent included propylene glycol methyl ether and ethyl lactate. A weight ratio of propylene glycol methyl ether with respect to ethyl lactate was about 4:1.

Experiment for Measuring an Affinity of a Photoresist Layer for Water

Photoresist layers were formed on substrates by using the photoresist compositions of Example and Comparative Examples 1 to 3. Thereafter, contact angles of pure water on the photoresist layers were measured.

TABLE 1

|  | Contact Angle |
|---|---|
| Example | 69.2° |
| Comparative Example 1 | 75.2° |
| Comparative Example 2 | 73.3° |
| Comparative Example 3 | 68° |

Referring to Table 1, the contact angle of pure water on the photoresist layer formed using the photoresist composition of Comparative Example 1 was larger than any other contact angles. It is because the photosensitive resin in the photoresist composition of Comparative Example 1 had the largest weight-average molecular weight. As a result, in case that the weight-average molecular weight of the photosensitive resin increases, the hydrophobicity of the photoresist composition may also increase.

Inspection of a Microbubble Defect on a Photoresist Pattern

Photoresist layers were formed on substrates by using the photoresist compositions of Example and Comparative Examples 1 to 3.

Thereafter, the photoresist layers were selectively exposed using an ArF excimer laser having a wavelength of about 193 nm. Exposed portions of the photoresist layers were then removed by developers to form photoresist patterns.

Figure 5:
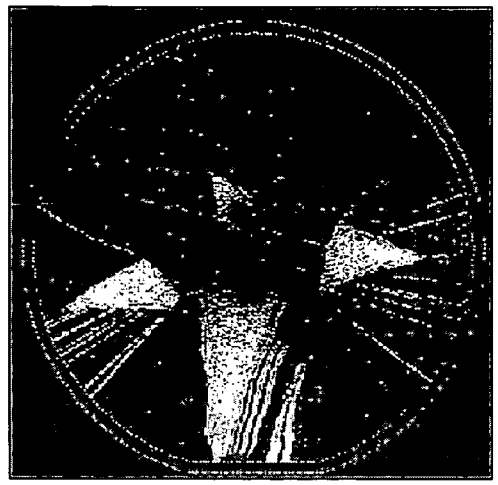
FIG. 5 is a map showing microbubble defects on a photoresist pattern formed using a photoresist composition of Example.
Figure 6:
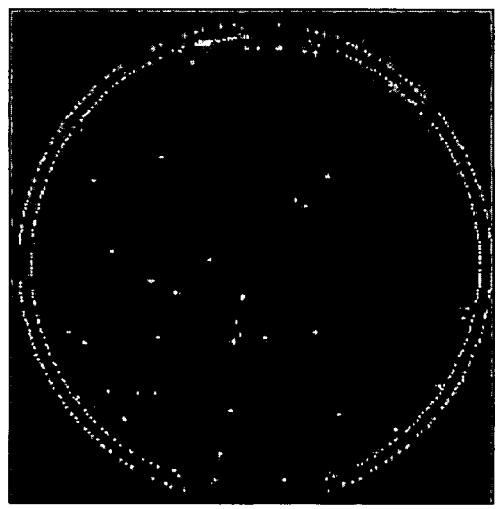
FIG. 6 is a map showing microbubble defects on a photoresist pattern formed using a photoresist composition of Comparative Example 1.
Figure 7:
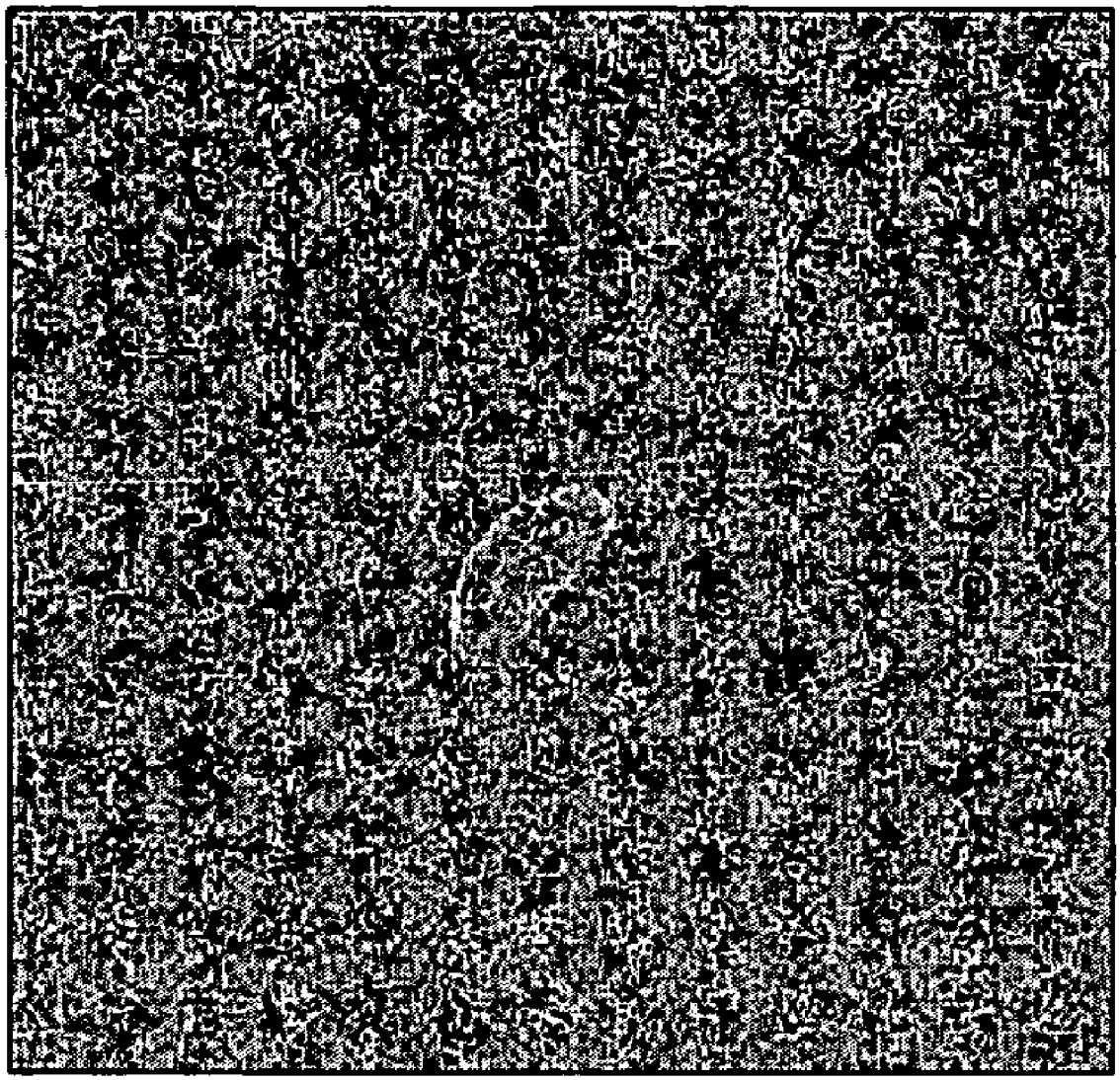
FIG. 7 is an SEM picture of the microbubble defect in FIG. 6.

FIG. 5 is a map showing the microbubble defects on the photoresist pattern formed using the photoresist composition of Example. FIG. 6 is a map showing the microbubble defects on the photoresist pattern formed using the photoresist composition of Comparative Example 1. FIG. 7 is an SEM picture of one of the microbubble defects in FIG. 6.

In FIGS. 5 and 6, a dot may correspond to one of the microbubble defects.

As shown in FIG. 5, the microbubble defects were hardly generated on the photoresist pattern formed using the photoresist composition of Example. On the other hand, as shown in FIG. 6, the microbubble defects were generated on the photoresist pattern formed using the photoresist composition of Comparative Example 1. In addition, as shown in FIG. 7, a microbubble defect is generated because a particle of the exposed portion of the photoresist layer is attached to the photoresist pattern.

Although it is not particularly shown as a map, the microbubble defects were generated on the photoresist pattern formed using the photoresist composition of Comparative Example 2. However, the microbubble defects were hardly generated on the photoresist pattern formed using the photoresist composition of Comparative Example 4.

As a result, in case that the weight-average molecular weight of the photosensitive resin decreases, the microbubble defects may be suppressed.

Experiment for Measuring Characteristics of a Photolithography Process

Photoresist layers were formed on substrates by using the photoresist compositions of Example and Comparative Examples 1 to 3.

Thereafter, exposure processes were performed on the photoresist layers. The exposure processes used an ArF excimer laser having a wavelength of about 193 mm. Exposed portions of the photoresist layers were then removed by developers to form photoresist patterns.

Depths of focus (DOF) were measured in the exposure processes. In addition, a line edge roughness (LER) and a critical line width were measured after the photoresist pattern was formed, for each of the examples. Here, the critical line width indicated a line width below which the photoresist pattern having a height of about 2,400 Å collapsed.

TABLE 2

|  | Depth of Focus (μm) | Line Edge Roughness (nm) | Critical Line Width (nm) |
|---|---|---|---|
| Example | 0.2 | 8.2 | 66 |
| Comparative Example 1 | 0.2 | 7.8 | 65 |
| Comparative Example 2 | 0.2 | 7.6 | 64 |
| Comparative Example 3 | 0 | 9.3 | 74 |

Referring to Table 2, in case that the photoresist pattern was formed using the photosensitive resin of Example, the depth of focus was substantially sufficient. In addition, the line edge roughness was satisfactory. Furthermore, the critical line width was relatively small. Particularly, the critical line width was about 66 nm.

However, in case that the photoresist pattern was formed using the photosensitive resin of Example, the microbubble defects were hardly generated. In addition, the characteristics of the photolithography process were satisfactory.

On the other hand, in case that the photoresist pattern was formed using the photosensitive resin of Comparative Example 3, the depth of focus was not sufficient. In addition, the line edge roughness was unsatisfactory. Furthermore, the critical line width was relatively large. Thus, in case that the photoresist pattern was formed using the photosensitive resin of Comparative Example 3, desired characteristics of the photoresist pattern were hardly obtained.

According to some embodiments of the present invention, a photoresist pattern hardly having microbubble defects may be efficiently formed. In addition, depth of focus may be sufficient in an exposure process used for forming the photoresist pattern. Furthermore, line edge roughness of the photoresist pattern may be unsatisfactory. In addition, a line width of the photoresist pattern may be reduced. Thus, a yield of a semiconductor device formed using the photoresist pattern may increase.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A photosensitive resin comprising a blocking group substituted for an acid, the photosensitive resin comprising at least one of a vinyl ether-maleic anhydride resin, and a cyclo-olefin-maleic anhydride resin, having a weight-average molecular weight of from about 6,300 up to about 7,700, the photosensitive resin having a blocking ratio of from about 5% up to about 40%.

2. The photosensitive resin of claim 1, wherein the blocking ratio is from about 30% up to about 40%.

3. A photoresist composition comprising:
   a photosensitive resin comprising at least one of a vinyl ether-maleic anhydride resin, and a cyclo-olefin-maleic anhydride resin, including a blocking group substituted for an acid, the photosensitive resin having a weight-average molecular weight of from about 6,300 up to about 7,700, the photosensitive resin having a blocking ratio of from about 5% up to about 40%;
   a photo-acid generator; and
   an organic solvent.

4. The photoresist composition of claim 3, wherein the photosensitive resin is from about 1 up to about 10 percent by weight, the photo-acid generator is from about 0.1 up to about 1 percent by weight, and the residual is the organic solvent.

5. The photoresist composition of claim 3, wherein the blocking ratio is from about 300% up to about 40%.

6. The photoresist composition of claim 3, wherein the photo-acid generator comprises at least one selected from the group consisting of a triarylsulfonium salt, a diaryliodonium salt, a sulfonate, and an N-hydroxysuccinimide triflate.

7. The photoresist composition of claim 3, wherein the organic solvent comprises at least one selected from the group consisting of ethylene glycol monomethyl ether, ethylene glycol monoethyl ether, propylene glycol methyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, diethylene glycol dimethyl ether, ethyl lactate, toluene, xylene, methyl ethyl ketone, cyclohexanone, 2-heptanone, 3-heptanone, and 4-heptanone.

8. The photoresist composition of claim 3, further comprising an organic base.

9. The photoresist composition of claim 8, wherein the organic base is from about 0.001 up to about 1 percent by weight, based on a total weight of the photoresist composition measured before the organic base is added.

10. The photoresist composition of claim 3, wherein a contact angle of pure water on a photoresist layer formed using the photoresist composition is from about 68° up to about 72°.

11. A method of forming a photoresist pattern, the method comprising:
   coating an object with a photoresist composition including a photosensitive resin comprising at least one of a vinyl ether-maleic anhydride resin, and a cyclo-olefin-maleic anhydride resin, a photo-acid generator and an organic solvent to form a photoresist layer on the object, the photosensitive resin including a blocking group substituted for an acid, the photosensitive resin having a weight-average molecular weight of from about 6,300 up to about 7,700, the photosensitive resin having a blocking ratio of from about 5% up to about 40%;
   selectively introducing light onto the photoresist layer to divide the photoresist layer into a first portion and a second portion, the first portion being provided with the light and being substantially hydrophilic, the second portion not being provided with the light; and forming a photoresist pattern by selectively removing the first portion and substantially preventing particles of the first portion from being attached to the second portion.

12. The method of claim 11, wherein the photosensitive resin is from about 1 to about 10 percent by weight, the photo-acid generator is from about 0.1 to about 1 percent by weight, and the residual is the organic solvent.

13. The method of claim 11, wherein the photoresist composition further comprises an organic base.

14. The method of claim 11, wherein a contact angle of pure water on a photoresist layer formed using the photoresist composition is from about 68° up to about 72°.

* * * * *

UNITED STATES PATENT AND TRADEMARK OFFICE
CERTIFICATE OF CORRECTION

PATENT NO. : 7,258,963 B2
APPLICATION NO. : 11/333934
DATED : August 21, 2007
INVENTOR(S) : Youn-Kyung Wang et al.

It is certified that error appears in the above-identified patent and that said Letters Patent is hereby corrected as shown below:

Column 13, line 1, the word "mm" should read -- nm --;
Column 14, line 23, the word "300%" should read -- 30% --;
Column 14, line 37, the word "cyclobexanone" should read -- cyclohexanone --.

Signed and Sealed this

Sixteenth Day of September, 2008

JON W. DUDAS
*Director of the United States Patent and Trademark Office*